United States Patent [19]

Linde et al.

[11] Patent Number: 5,114,757

[45] Date of Patent: May 19, 1992

[54] ENHANCEMENT OF POLYIMIDE ADHESION ON REACTIVE METALS

[76] Inventors: Harold G. Linde, HCR, Box 188; Rosemary A. Previti-Kelly, R.D. 1, Box 213-7, both of Richmond, Vt. 05477

[21] Appl. No.: 604,702

[22] Filed: Oct. 26, 1990

[51] Int. Cl.$^5$ .............................. B05D 3/02
[52] U.S. Cl. ........................ 427/387; 357/8; 357/52; 427/409; 437/235; 437/243
[58] Field of Search ............ 148/73.3; 357/52, 8; 427/387, 409; 437/235, 243

[56] References Cited

U.S. PATENT DOCUMENTS

| | | | |
|---|---|---|---|
| 494,006 | 3/1890 | Linde et al. | |
| 3,179,614 | 4/1965 | Edwards | 260/30.2 |
| 3,264,250 | 8/1966 | Gall | 260/32.6 |
| 3,520,683 | 7/1970 | Kerwin | 96/35.1 |
| 4,030,948 | 6/1977 | Berger | 148/33.3 |
| 4,103,045 | 7/1978 | Lesaicherre et al. | 427/82 |
| 4,529,618 | 7/1985 | Ponjee et al. | 427/82 |
| 4,590,258 | 5/1986 | Linde et al. | 528/189 |
| 4,612,210 | 9/1986 | Hofer et al. | 427/82 |
| 4,626,556 | 12/1986 | Nozue et al. | 522/99 |
| 4,723,978 | 2/1988 | Clodgo et al. | 65/31 |
| 4,782,009 | 11/1988 | Bolon et al. | 430/326 |
| 4,786,569 | 11/1988 | Rohde et al. | 430/14 |

FOREIGN PATENT DOCUMENTS 0226208  6/1987  European Pat. Off. .

OTHER PUBLICATIONS

Rothman, L. B., "Properties of Thin Polyimide Films", J. Electrochem. Soc.: Solid-State Sci. and Technology, vol. 127, No. 10 (Oct. 1980), pp. 2216–2220.

Anderson, D. R. et al., "Silicone-Polyimide Polymers as Adhesion Promoters", IBM Tech. Discl. Bull., vol. 27, No. 3, (Aug. 1984), p. 1418.

*Primary Examiner*—Michael Lusignan
*Attorney, Agent, or Firm*—William D. Sabo

[57] ABSTRACT

In order to improve the adhesion of a polyimide layer to an underlying metal surface, an organic solution which cures to a silsesquioxane copolymer is applied to the surface. The polyimide and the copolymer are formed during a simultaneous curing step.

28 Claims, No Drawings

ENHANCEMENT OF POLYIMIDE ADHESION ON REACTIVE METALS

BACKGROUND OF THE INVENTION

1. Field of the Invention

The present invention relates to a process for improving the adhesion of a polyimide layer to an underlying metal surface, such as a substrate containing a pattern of metallization, e.g. copper.

2. Description of the Prior Art

It is known that polyimides formed by the thermal curing of polyimide precursors, such as polyamic acids, can be used as passivation dielectrics on semiconductor devices. See, for example, U.S. Pat. No. 4,590,258, issued to Linde, et al., on May 20, 1986. A problem arises, however, in that polyimides adhere poorly to metal surfaces, enhancing moisture penetration and oxidation at the interface, which result in a loss of its passivation function.

Techniques are known in the art for improving the adhesion of various polymers to underlying substrates. For example, U.S. Pat. No. 4,103,045, issued to Lesaicherre, et al., on Jul. 25, 1978, describes a process for bonding a photoresist polymer to an inorganic oxide layer, by applying to the layer a solution of a selected aminosilane or cyclopolysiloxazane. Similarly, U.S. Pat. No. 4,529,618, issued to Ponjee, et al. on Jul. 16, 1985, first treats an inorganic material with an aqueous solution of a 3-aminopropyltrialkoxysilane before applying a photoresist polymer.

It is also known to form silsesquioxane polymers for use as insulating layers in semiconductor devices. For example, in Eur. Pat. Appln., published under No. 0,226,208 on Jun. 24, 1987, an insulating layer is formed by applying to a substrate a prepolymer, and then heating it at a temperature above 400° C. in the presence of oxygen. The prepolymer is prepared by hydrolyzing and polycondensating a mixture of a tetraalkoxysilane, a trialkoxysilane and a dialkoxysilane in a select mole ratio.

In U.S. Pat. No. 4,626,556, issued to Nozue, et al., on Dec. 2, 1986, water is reacted with a trihalogenosilane in the production of a non-amino-containing silsesquioxane polymer, which is used in a mixture with a compound which generates crosslinking-reaction-active species upon irradiation, in the formation of an insulating layer. In U.S. Pat. No. 4,723,978, issued to Clodgo, et al., on Feb. 9, 1988, an organoglass insulating layer is produced by first forming a modified ladder-type silsesquioxane polymer from a silanol solution, and then treating it in an oxygen plasma.

However, none of these approaches involves the formation of a silsesquioxane polymer as an adhesion-promoting layer.

SUMMARY OF THE INVENTION

It is against this background that the present invention provides an improved process for bonding a polyimide layer to an underlying metal surface. In accordance with the invention, an organic solution is first applied to the underlying metal surface, the solution being prepared by reacting an aminoalkoxysilane monomer, an arylalkoxysilane or arylsilazane monomer and water in a solvent. After that, a heating step is performed to form a partially cured layer, and then a solution comprising a polyimide precursor is applied. Another heating step is carried out to simultaneously form a layer of cured silsesquioxane copolymer and a polyimide layer. In the practice of the invention, a cured structure is obtained in which there is a strong bonding between the polyimide and the underlying layers, which is moisture-resistant and resistant to oxidation of the metal, while also providing a high degree of thermal stability. The process also allows application of the polyimide without the need for a separate, full curing step for the adhesion-enhancing layer.

DETAILED DESCRIPTION

In accordance with the process, an organic solution is applied to an underlying metal surface, such as a metal film or a processed semiconductor substrate, containing a pattern of metallization. In such cases, the substrate typically comprises an insulator layer which includes a pattern of metal. For example, the insulator layer commonly comprises silicon dioxide, silicon nitride, re-flowed phosphosilicate glass or a polyimide, such as polyimides formed from pyromellitic dianhydride and oxydianiline, or benzophenone tetracarboxylic acid dianhydride and oxydianiline and/or m-phenylene diamine or other aromatic polyimides or polyamide-imides known to those skilled in the art. Typical metals include transition metals or alloys of transition metals, refractory metals or silicides of refractory metals, etc., for example, copper, aluminum, silver, chromium, lead, tin, gold, the Groups IVA, VA and VIA metals, such as titanium and tungsten, and so forth.

The organic solution is applied to the underlying surface in a conventional fashion, such as spin coating, at a spin speed of about 2,000–5,000 rpm, depending upon the desired thickness. The organic solution is prepared by reacting an aminoalkoxysilane monomer, an arylalkoxysilane or arylsilazane monomer and water in a solvent. Suitable aminoalkoxysilane monomers include aminotrialkoxysilanes represented by the formula:

$$HN(R_1)-R_2-Si(OR_3)_3 \quad (A)$$

wherein $R_1$ is a hydrogen atom; a saturated hydrocarbon residue or an amino-substituted, preferably di- or tri-amino-substituted, saturated hydrocarbon residue, preferably having 1 to 5 carbon atoms; or an alkyl-substituted phenyl group or derivatives thereof, the alkyl group preferably having 1 to 5 carbon atoms; wherein $R_2$ is a saturated hydrocarbon residue, preferably having 2 to 6 carbon atoms or an alkyl-substituted, preferably dialkyl-substituted, phenyl group or derivatives thereof, each alkyl group preferably having 1 to 5 carbon atoms; and wherein $R_3$ is a saturated hydrocarbon residue, preferably having 1 to 8 carbon atoms. Also, mixtures of such aminotrialkoxysilanes can be used.

Representative aminoalkoxysilane monomers include the following: γ-aminopropyltriethoxysilane, γ-aminopropyltrimethoxysilane, N-β-(aminoethyl)-γ-aminopropyltrimethoxysilane, N-β-(aminoethyl)-γ-aminopropyltriethoxysilane, N-β-aminoethyl-γ-aminopropyltris-(β-ethylhexoxy) silane, trimethoxysilylpropyldiethylenetriamine, (aminoethylaminomethyl)phenethyltrimethoxysilane and α-trimethoxysilyl-β-(p-m-aminomethyl)-phenylethane.

Preferred aminoalkoxysilane monomers include aminotrialkoxysilanes represented by the above formula (A), wherein $R_1$ is a hydrogen atom or a saturated hydrocarbon residue or an amino-substituted, saturated hydrocarbon residue, having 2 or 3 carbon atoms; wherein $R_2$ is a saturated hydrocarbon residue having 3 to 6 carbon atoms; and wherein $R_3$ is a saturated hydrocarbon residue having 1 to 4 carbon atoms.

A particularly preferred group of aminoalkoxysilane monomers includes the following aminotrialkoxysilanes: γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane.

The arylalkoxysilane or arylsilazane monomer employed in preparing the solution is preferably represented by the formula:

$$R_4\text{-Si-(Y)}_3 \qquad (B)$$

wherein $R_4$ is an unsubstituted or substituted aromatic residue, such as

$$CH_3(CH_2)_n C_6(R_5)_4 \qquad (C)$$

wherein n=0–6, and more preferably 0–3, e.g. benzyl or higher functionalities, and $R_5$ is a hydrogen atom or a saturated hydrocarbon residue, preferably having 1 to 8 carbon atoms, more preferably 1 to 4 carbon atoms, e.g. xylyl or mesitylyl; and wherein Y is $(OR_6)$ or $N(R_7)_2$, wherein $R_6$ is a saturated hydrocarbon residue having 1 to 5 carbon atoms and $R_7$ is a hydrogen atom or a saturated hydrocarbon residue having 1 to 5 carbon atoms. Also, mixtures of such arylalkoxysilanes and arylsilazanes can be used.

Representative arylalkoxysilane and arylsilazane monomers include the following: phenyltriethoxysilane, tris (dimethylamino) phenylsilane, bis (dimethylamino) diphenylsilane and bis (dimethylamino) methylphenylsilane.

Particularly preferred arylalkoxysilane and arylsilazane monomers include those in which $R_4$ is an unsubstituted or substituted phenyl group, and $R_6$ is a saturated hydrocarbon residue having 1 to 4 carbon atoms or $R_7$ is a hydrogen atom or a saturated hydrocarbon residue having 1 to 4 carbon atoms. Arylalkoxysilane monomers are most preferred, such as phenyltrialkoxysilane, e.g. phenyltriethoxysilane.

Any suitable solvent which can dissolve the aminoalkoxysilane and the arylalkoxysilane or arylsilazane and is miscible with water can be employed. Typical solvents include, for example, alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, tetrahydrofuran, and the like; aromatic alcohols, such as phenol, and the like; polyhydric alcohols, such as ethylene glycol, tetramethylene glycol, and the like; ketones, such as methyl ethyl ketone, methyl isobutyl ketone, diethyl ketone, and the like; etc., as well as mixtures thereof, as will be apparent to those skilled in the art. Preferred solvents include methanol, ethanol and isopropanol.

Preferably, the reaction is carried out by employing a mole ratio of arylalkoxysilane monomer to aminoalkoxysilane monomer in the range from about 1:3 to about 4:1, more preferably from about 2:3 to about 2.5:1, and a mole ratio of water/total monomer in the range from about 0.5:1 to about 2:1, more preferably from about 0.9:1 to about 1.7:1.

Other monomers may be added in preparing the organic solution. For example, to improve uniformity of the layer, higher functionality silane monomers, such as tetrafunctional silane monomers, which facilitate crosslinking, may be employed. In one preferred embodiment of the invention, the organic solution is prepared by reacting, in addition to the aminoalkoxysilane and arylalkoxysilane or arylsilazane monomers and water, a tetraalkoxysilane monomer, such as tetraethoxysilane. Preferably, the tetraalkoxysilane monomer is employed in a proportion up to about 50 percent, more preferably up to about 45 percent, and most preferably about 20 to about 45 percent, based on the moles of total monomer.

For additional details on the organic solution that is employed and its preparation, reference may be had to copending U.S. application, Ser. No. 494,006, filed Mar. 15, 1990, the entire contents of which are incorporated herein by reference.

The coated surface is then heated at a temperature which is sufficient to drive off the solvent and form a partially cured layer. It is not necessary to fully cure the layer at this point; in fact, it is only desired to cure the layer to the extent that it has sufficient integrity for application of the solution in the next step. Generally speaking, the temperature will usually range from about 85° to about 150° C., preferably from about 90° to about 110° C., for a time ranging from about 0.5 to about 20 minutes, preferably from about 5 to about 10 minutes. However the actual conditions of partial curing may vary broadly depending upon a number of factors, such as the particular monomers employed in the organic solution, as well as their molar ratios, etc., as should be apparent to those skilled in the art.

Next, a solution comprising a polyimide precursor material is applied to the partially cured layer by any suitable process. Suitable polyimide precursor materials include polyamic acid polymers which are based on the condensation of aromatic dianhydrides with diamines, more preferably aromatic diamines, and the corresponding polyamic ester polymers. Suitable aromatic dianhydrides include pyromellitic dianhydride, 2,2-bis(3,4-dicarboxyphenyl) propane dianhydride, 2,3,6,7-naphthalene tetracarboxylic dianhydride, 2,2',3,3'-diphenyl tetracarboxylic dianhydride, and benzophenone tetracarboxylic dianhydride. Suitable diamines include m-phenylene diamine, p-phenylene diamine, and 4,4'-diaminophenyl ether. Illustrative polyimide precursor materials useful for the purposes of this invention and their methods of preparation are disclosed in U.S. Pat. Nos. 3,179,614, 3,264,250 and 4,612,210, the entire disclosures of which are incorporated herein by reference. Particularly preferred polyamic acid polymers are available from E.I. duPont deNemours and Company, Wilmington, Del., under the trade designations "PI-5810D", "PI-2545" and "PI-2525".

Typically, the polyimide precursor is dissolved in a suitable inert solvent, and then the solution is applied to the partially cured layer by spin coating, at a spin speed of about 1000–7000 rpm, depending upon the desired thickness. The solvents are not unduly limited, and a number of solvents or solvent mixtures can be used, for example, N-methyl pyrrolidinone (NMP), dimethyl acetamide (DMAc), dimethyl formamide (DMF), dimethyl sulfoxide (DMSO) or suitable mixtures of these solvents with various conventional hydrocarbon solvents.

After applying the solution, the surface is heated to simultaneously cure the partially cured layer and the polyimide precursor material. During this step, the partially cured layer is cured to form a silsesquioxane copolymer and the polyimide precursor material is converted to the corresponding polyimide. The actual curing conditions, i.e. temperature, pressure and time, may vary over wide ranges and are generally dependent on the monomers employed in the organic solution and their molar ratios, the polyimide precursor material employed, the desired thicknesses of the cured layers being produced, as well as other factors which should be apparent to those skilled in the art. In general, however, temperatures in excess of about 200° C., for a period of about 15–60 minutes at atmospheric pressure are typical.

In a preferred embodiment, the heat treatment is performed in a series of steps at atmospheric pressure. In this manner, the substrate is exposed to a temperature of about 85°–160° C., or sequential temperatures within that range, to drive off solvent, and then to a high temperature, in excess of about 350° C. to form the final cured layers.

Apparently, during the curing step, the copolymer coordinates to the underlying metal through the amino groups, and it further serves to passivate the metal surface. In addition, the copolymer seems to further react with the polyimide precursor to form an amine salt which imidizes in the usual fashion, forming a covalent attachment through the amino groups. In any event, the layer of cured silsesquioxane copolymer provides a strong bond between the polyimide layer and the metal surface, and which is moisture-resistant and oxidation resistant. In addition, it has been found to demonstrate enhanced thermal stability characteristics over conventionally used adhesion promoters, while providing desirable electrical properties, such as low dielectric constant. As a further processing advantage, the adhesion promoting layer is formed without requiring a separate, full curing step.

The following examples are provided to illustrate the invention.

PREPARATION OF ORGANIC SOLUTIONS

Comparative Example A

A 490 ml aliquot of dry (<0.01% $H_2O$) methanol was transferred into a clean, dry Nalgene (polyethylene) bottle. A 10 ml aliquot of high purity[1] 3-aminopropyltriethoxysilane[2] was added to the methanol, and the solution was thoroughly mixed with the cap in place to control exposure to the atmosphere. A 1 ml aliquot of deionized, distilled $H_2O$ was then added with swirling of the silane/methanol solution, the bottle was capped, and the mixture was shaken vigorously for 10–20 seconds. The closed container was placed on a roller mill and mixed for about 16 hours at room temperature. The aged solution was filtered using a 0.2μ polypropylene filter under conditions ensuring minimal atmospheric exposure.

1. Monomer content >99.5% (Gas Chromatography), and total ionics' concentration <5 ppm.
2. Commercially available from Union Carbide under the designation "A1100".

Example 1

A 490 ml aliquot of dry (<0.01% $H_2O$) methanol was transferred into a clean, dry Nalgene (polyethylene) bottle. A 5 ml aliquot of high purity[1] phenyltriethoxysilane[2] was added to the methanol, and the solution was thoroughly mixed with the cap in place to control exposure to the atmosphere. A 1 ml aliquot of deionized, $H_2O$ was then added with swirling of the silane/methanol solution, the bottle was capped, and the mixture was shaken vigorously for 10–20 seconds. A magnetic stir bar was placed in the solution and the bottle placed on a magnetic stirrer. At this time 5 ml of high purity[1] 3-aminopropyltriethoxysilane[3] was placed in a polypropylene addition funnel and connected to the bottle, and it was added over the course of 1 hour with good stirring. After addition the bottle was placed on a roller mill and mixed for about 16 hours. The aged solution was filtered using a 0.2μ polypropylene filter under conditions ensuring minimal atmospheric exposure.

1. Monomer content >99.5% (Gas Chromatography), and total ionics' concentration <5 ppm.
2. Commercially available from Petrarch Systems, Inc. under the designation "PO320".
3. Commercially available from Union Carbide under the designation "A1100".

Comparative Example B

A 490 ml aliquot of dry (<0.01% $H_2O$) methanol was transferred into a clean, dry Nalgene (polypropylene) bottle. A 10 ml aliquot of high purity[1] N-β-aminoethyl-γaminopropyltrimethoxysilane[2] was added to the methanol, and the solution was thoroughly mixed with the cap in place to control exposure to the atmosphere. A 1 ml aliquot of deionized, distilled $H_2O$ was then added with swirling of the silane/methanol solution, the bottle was capped, and the mixture was shaken vigorously for 10–20 seconds. The closed container was placed on a roller mill and mixed for about 16 hours at room temperature. The aged solution was filtered using a 0.2μ polypropylene filter under conditions ensuring minimal atmospheric exposure.

1. Monomer content >99.5% (Gas Chromatography), and total ionics' concentration <5 ppm.
2. Commercially available from Dow Corning Corp. under the designation "Z6020".

Example 2

A 490 ml aliquot of dry (<0.01% $H_2O$) methanol was transferred into a clean, dry Nalgene (polyethylene) bottle. A 5 ml aliquot of high purity[1] phenyltriethoxysilane[2] was added to the methanol, and the solution was thoroughly mixed with the cap in place to control exposure to the atmosphere. A 1 ml aliquot of deionized, $H_2O$ was then added with swirling of the silane/methanol solution, the bottle was capped, and the mixture was shaken vigorously for 10–20 seconds. A magnetic stir bar was placed in the solution and the bottle placed on a magnetic stirrer. At this time 5 ml of high purity[1] N-β-aminoethyl-γ-aminopropyltrimethoxysilane[3] was placed in a polypropylene additional funnel and connected to the bottle, and it was added over the course of 1 hour with good stirring. After addition the bottle was placed on a roller mill and mixed for about 16 hours. The aged solution was filtered using a 0.2μ polypropylene filter under conditions ensuring minimal atmospheric exposure.

1. Monomer content >99.5% (Gas Chromatography), and total ionics' concentration <5 ppm.
2. Commercially available from Petrarch Systems, Inc. under the designation "PO320".
3. Commercially available from Dow Corning Corp. under the designation "Z6020".

Example 3

A 385 ml aliquot of dry (<0.01% $H_2O$) methanol was transferred into a clean, dry Nalgene (polyethylene) bottle. A 5 ml aliquot of high purity[1] phenyltriethoxysilane[2] was added to the methanol, and the solution was thoroughly mixed with the cap in place to control exposure to the atmosphere. A 1.25 ml aliquot of deionized, H$_2$O was then slowly added with swirling of the silane/methanol solution, the bottle was capped, and the mixture was shaken vigorously for 10–20 seconds. A magnetic stir bar was placed in the solution and the bottle placed on a magnetic stirrer. At this time 2.4 ml of high purity[1] 3-aminopropyltriethoxysilane[3] was placed in a polypropylene addition funnel with 100 ml of dry methanol and connected to the bottle, and the solution was added over the course of 1 hour with good stirring. Then, 4.6 ml of tetraethoxysilane (TEOS)[4] was added over the course of a few minutes with good stirring. After addition the bottle was placed on a roller mill and mixed for about 16 hours. The aged solution was filtered using a 0.2μ polypropylene filter under conditions ensuring minimal atmospheric exposure.

1. Monomer content >99.5% (Gas Chromatography), and total ionics' concentration <5 ppm.
2. Commercially available from Petrarch Systems, Inc. under the designation "PO320".
3. Commercially available from Union Carbide under the designation "A1100".
4. Commercially available from Petrarch Systems, Inc.

FORMATION OF CURED STRUCTURES

Comparative Examples C and D and Examples 4–6

The organic solutions prepared above were then applied to silicon substrate wafers. The wafers were prepared by evaporating a layer (5,000 Å) of titanium on to the surface, followed by a layer (10,000 Å) of copper. The coated wafers were then annealed in forming gas (10% hydrogen/90% nitrogen) at 400° C. for 30 minutes. The organic solutions were applied to the copper-coated wafers and let stand for 15 sec., then spun at a speed of 3,000 rpm for 30 seconds. The substrates were then heated at a temperature of 100° C. for 10 minutes to remove excess methanol and to form a partially cured layer on the substrate.

Following that, a solution of polyamic acid (11% solids, based on biphenylene tetracarboxylic dianydride and p-phenylene diamine, commercially available from E.I. duPont deNemours and Company under the designation "PI-5810D") in NMP was spin applied to the partially cured layer, at an initial spin speed of 500 rpm for 15 seconds, followed by a final spin speed of 4,000 rpm for 30 seconds. The wafers were then baked in air on an 8-position hotplate at temperatures of 95° C./105° C./105° C./115° C./115° C./135° C./135° C./135° C. for 2.5 minutes each at ambient pressure. Thereafter, the wafers were subjected to a final cure step at a temperature of 400° C. for 45 minutes in an oven, with a flow of dry nitrogen, filtered to eliminate particulates >0.2μ in diameter, maintained to minimize substrate oxidation by controlling the oxygen content to <10 ppm.

The above-noted procedure produced cured structures, with a silsesquioxane film approximately 200 Å thick and a polyimide film approximately 10,000 Å thick.

The cured structures were then subjected to testing, with the results being summarized in TABLE I below. In the Peel test, scribe lines were marked in the undersides of the wafers. The wafers were then cleaved, leaving the cured polyimide film intact. The wafers were then bent to a 90° angle, the polyimide film serving as a hinge, and the adhesion properties were observed. Reference is made to Rothman, L. B., "Properties of Thin Polyimide Films", J. Electrochem. Soc.: Solid-State Science and Technology, Vol. 127, No. 10 (October 198), pp. 2216–2220, the entire disclosure of which is incorporated herein by reference, for a more detailed description. The tests were conducted after exposing the wafers to moisture (85° C./80% relative humidity for 14 days). The following criteria were used: full peel, where the polyimide film across the entire width debonded from the silsesquioxane copolymer surface; partial peel, where the polyimide film did not completely debond across the entire width from the silsesquioxane copolymer surface; and no peel, where the polyimide film did not debond at all from the silsesquioxane copolymer surface.

Corrosion resistance was determined by measuring the reflectivity of the copper surfaces, in each cured structure, employing a Hitachi UV visible spectrophotometer with reflectance accessory using absorbance at 800 nm with an aluminum mirror standard to zero the instrument. The following numerical scale was used: copper, 0.05–0.1; and oxidized copper, 0.66. The structures of Examples 4–6 showed low absorbance values, demonstrating that the silsesquioxane polymer layer provided excellent protection against corrosion of the underlying copper.

TABLE I

| Example or Comparative Example | Organic Solution (Example or Comparative Example No.) | Peel Test | Absorbance |
| --- | --- | --- | --- |
| C | A | Full | 0.35 |
| 4 | 1 | Partial/Full[1] | 0.17 |
| D | B | No | 0.39 |
| 5 | 2 | No | 0.15 |
| 6 | 3 | Partial | 0.19 |

[1]Two wafers, three sites per wafer, were tested. Of the six cleaves, five showed partial and one showed full peel.

We claim:

1. A process for improving the adhesion of a polyimide layer to a metal surface, comprising the steps of:
   applying to said surface an organic solution, prepared by reacting an aminoalkoxysilane monomer, an arylalkoxysilane or arysilazane monomer and water in a solvent;
   heating said surface under such conditions as to form a partially cured layer on said surface;
   applying to said partially cured layer a solution comprising a polyimide precursor material; and
   heating said surface under such conditions as to simultaneously form a layer of cured silsesquioxane copolymer, containing reactive amino groups which coordinate to said metal, and which passivates said metal and a polyimide layer.

2. The process of claim 1, wherein:
   said aminoalkoxysilane monomer is an aminotrialkoxysilane represented by the formula:

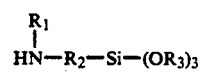

wherein:
   R$_1$ is a hydrogen atom; a saturated hydrocarbon residue or an amino-substituted, saturated hydrocarbon residue, having 1 to 5 carbon atoms; or an alkyl-substituted phenyl group or derivatives thereof, the alkyl group having 1 to 5 carbon atoms;

$R_2$ is a saturated hydrocarbon residue having 2 to 6 carbon atoms or an alkyl-substituted phenyl group, each alkyl group having 1 to 5 carbon atoms; and $R_3$ is a saturated hydrocarbon residue having 1 to 8 carbon atoms;

or a mixture thereof; and said arylalkoxysilane or arylsilazane monomer is represented by the formula, $R_4$-Si-$(Y)_3$, wherein $R_4$ is an unsubstituted or substituted aromatic residue and Y is $(OR_6)$ or $N(R_7)_2$, wherein $R_6$ is a saturated hydrocarbon residue having 1 to 5 carbon atoms and $R_7$ is a hydrogen atom or a saturated hydrocarbon residue having 1 to 5 carbon atoms.

3. The process of claim 2, wherein said reaction is carried out by employing a mole ratio of arylalkoxysilane monomer to aminoalkoxysilane monomer in the range from about 1:3 to about 4:1, and a mole ratio of water/total monomer in the range from about 0.5:1 to about 2:1.

4. The process of claim 3, wherein said reaction is carried out by employing a mole ratio of arylalkoxysilane monomer to aminoalkoxysilane monomer in the range from about 2:3 to about 2.5:1, and a mole ratio of water/total monomer in the range from about 0.9:1 to about 1.7:1.

5. The process of claim 2, wherein:

said organic solution is prepared by first dissolving said arylalkoxysilane or arylsilazane monomer in said solvent, adding water, and then adding said aminoalkoxysilane monomer;

said solvent is selected from the group consisting of methanol, ethanol and isopropanol; and said solution is allowed to age for a period of at least about 2 hours, before application to said substrate.

6. The process of claim 2, wherein said organic solution is prepared by reacting an aminoalkoxysilane monomer, an arylalkoxysilane or arylsilazane monomer, a tetraalkoxysilane monomer and water in a solvent.

7. The process of claim 6, wherein said tetraalkoxysilane monomer is tetraethoxysilane and is employed in a proportion of about 20 to about 45 percent based on the moles of total monomer.

8. The process of claim 2, wherein:

said aminotrialkoxysilane monomer is represented by the formula:

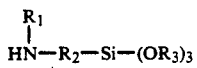

wherein:

$R_1$ is a hydrogen atom or a saturated hydrocarbon residue or an amino-substituted, saturated hydrocarbon residue, having 2 or 3 carbon atoms;

$R_2$ is a saturated hydrocarbon residue having 3 to 6 carbon atoms; and $R_3$ is a saturated hydrocarbon residue having 1 to 4 carbon atoms;

or a mixture thereof; and said arylalkoxysilane or arylsilazane monomer is represented by the formula, $R_4$-Si-$(Y)_3$, wherein $R_4$ is an unsubstituted or substituted phenyl group and Y is $OR_6$ or $N(R_7)_2$, wherein $R_6$ is a saturated hydrocarbon residue having 1 to 4 carbon atoms, and $R_7$ is a hydrogen atom or a saturated hydrocarbon residue having 1 to 4 carbon atoms.

9. The process of claim 8, wherein said aminotrialkoxysilane monomer is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane, and said arylalkoxysilane monomer is phenyltriethoxysilane.

10. The process of claim 1, wherein said surface is heated at a temperature from about 85° to about 150° C. for a period from about 0.5 to about 20 minutes to form said partially cured layer.

11. The process of claim 10, wherein said surface is heated at a temperature from about 90° to about 110° C. for a period from about 5 to about 10 minutes to form said partially cured layer.

12. The process of claim 1, wherein a solution comprising biphenylenedianhydride-p-phenylenediamine polyamic acid or ester is applied to said partially cured layer.

13. The process of claim 1, wherein a solution comprising pyromellitic dianhydride-oxydianiline polyamic acid or ester is applied to said partially cured layer.

14. The process of claim 1, wherein said simultaneous curing step is carried out at a temperature in excess of about 200° C.

15. The process of claim 14, wherein said simultaneous curing step is carried out at a temperature in excess of about 350° C.

16. The process of claim 1, wherein said metal is selected from the group consisting of copper, aluminum, silver, chromium, lead, tin, gold, titanium and tungsten.

17. A process for improving the adhesion of a polyimide layer to a semiconductor substrate containing a pattern of metallization, comprising the steps of:

applying to said substrate an organic solution, prepared by reacting an aminoalkoxysilane monomer, an arylalkoxysilane or arylsilazane monomer and water in a solvent, wherein said aminoalkoxysilane monomer is represented by the formula:

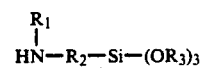

wherein:

$R_1$ is a hydrogen atom or a saturated hydrocarbon residue or an amino-substituted, saturated hydrocarbon residue, having 2 or 3 carbon atoms;

$R_2$ is a saturated hydrocarbon residue having 3 to 6 carbon atoms; and $R_3$ is a saturated hydrocarbon residue having 1 to 4 carbon atoms;

or a mixture thereof;

said arylalkoxysilane or arylsilazane monomer is represented by the formula, $R_4$-Si-$(Y)_3$, wherein $R_4$ is an unsubstituted or substituted phenyl group and Y is $OR_6$ or $N(R_7)_2$, wherein $R_6$ is a saturated hydrocarbon residue having 1 to 4 carbon atoms, and $R_7$ is a hydrogen atom or a saturated hydrocarbon residue having 1 to 4 carbon atoms; and said reaction is carried out by employing a mole ratio of arylalkoxysilane monomer to aminoalkoxysilane monomer in the range from about 1:3 to about 4:1, and a mole ratio of water/total monomer in the range from about 0.5:1 to about 2:1;

heating said substrate at a temperature from about 85° to about 150° C. for a period from about 0.5 to about 20 minutes to form said partially cured layer;

applying to said partially cured layer a solution comprising a polyimide precursor material; and heating said substrate at a temperature in excess of 200° C. to form a layer of cured silsesquioxane copolymer, containing reactive amino groups which coordinate to said metal, and which passivates said metal and a polyimide layer.

18. The process of claim 17, wherein said aminotrialkoxysilane monomer is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane, and said arylalkoxysilane monomer is phenyltriethoxysilane.

19. The process of claim 18, wherein said substrate is heated at a temperature from about 90° to about 110° C. for a period from about 5 to about 10 minutes to form said partially cured layer; and said simultaneous curing step is carried out at a temperature in excess of about 350° C.

20. The process of claim 19, wherein said organic solution is prepared by reacting an aminoalkoxysilane monomer, an arylalkoxysilane or arylsilazane monomer, a tetraalkoxysilane monomer and water in a solvent.

21. The process of claim 20, wherein said tetraalkoxysilane monomer is tetraethoxysilane and is employed in a proportion of about 20 to about 45 percent based on the moles of total monomer.

22. A cured composite structure, comprising a metal, a polyimide layer, and a layer of silsesquioxane copolymer intermediate said metal and said polyimide layer, said copolymer being employed to improve the adhesion of said polyimide layer to said metal, said structure being produced according to the process of claim 1.

23. A cured composite structure, comprising a metal, a polyimide layer, and a layer of silsesquioxane copolymer intermediate said metal and said polyimide layer, said copolymer being employed to improve the adhesion of said polyimide layer to said metal, said structure being produced according to the process of claim 8.

24. A cured composite structure, comprising a metal, a polyimide layer, and a layer of silsesquioxane copolymer intermediate said metal and said polyimide layer, said copolymer being employed to improve the adhesion of said polyimide layer to said metal, said structure being produced according to the process of claim 9.

25. A semiconductor structure, comprising a substrate containing a pattern of metallization, a polyimide layer, and a layer of silsesquioxane copolymer intermediate said substrate and said polyimide layer, said copolymer being employed to improve the adhesion of said polyimide layer to said metal, said structure being produced according to the process of claim 17.

26. A semiconductor structure, comprising a substrate containing a pattern of metallization, a polyimide layer, and a layer of silsesquioxane copolymer intermediate said substrate and said polyimide layer, said copolymer being employed to improve the adhesion of said polyimide layer to said metal, said structure being produced according to the process of claim 19.

27. A cured composite structure, comprising a metal, a polyimide layer, and a layer of silsesquioxane copolymer intermediate said metal and said polyimide layer, said copolymer containing reactive amino groups which coordinate to said metal, and which passivates said metal, said copolymer being employed to improve the adhesion of said polyimide layer to said metal.

28. A semiconductor structure, comprising a substrate containing a pattern of metallization, a polyimide layer, and a layer of silsesquioxane copolymer intermediate said substrate and said polyimide layer, said copolymer containing reactive amino groups which coordinate to said metal, and which passivates said metal, said copolymer being employed to improve the adhesion of said polyimide layer to said metal.

* * * * *